US010406567B2

(12) United States Patent
Hong et al.

(10) Patent No.: US 10,406,567 B2
(45) Date of Patent: Sep. 10, 2019

(54) APPARATUS AND METHODS FOR SUBSTRATE PROCESSING AND MANUFACTURING INTEGRATED CIRCUIT DEVICES

(71) Applicants: Dong-kwan Hong, Hwaseong-si (KR); Won-ho Jang, Yongin-si (KR); Sung-bae Kong, Suwon-si (KR)

(72) Inventors: Dong-kwan Hong, Hwaseong-si (KR); Won-ho Jang, Yongin-si (KR); Sung-bae Kong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 253 days.

(21) Appl. No.: 14/721,405

(22) Filed: May 26, 2015

(65) Prior Publication Data

US 2016/0059277 A1   Mar. 3, 2016

(30) Foreign Application Priority Data

Aug. 29, 2014  (KR) .................. 10-2014-0114526

(51) Int. Cl.
*B08B 7/00* (2006.01)
*H01L 21/67* (2006.01)
*H01L 21/02* (2006.01)

(52) U.S. Cl.
CPC ...... *B08B 7/0021* (2013.01); *H01L 21/02101* (2013.01); *H01L 21/67017* (2013.01); *H01L 21/6719* (2013.01); *H01L 21/67028* (2013.01); *H01L 21/67034* (2013.01)

(58) Field of Classification Search
CPC ......... H01L 21/02101; H01L 21/67034; B08B 7/0021
See application file for complete search history.

(56) References Cited

U.S. PATENT DOCUMENTS

| 1,369,900 | A | * | 3/1921 | Macy | ...................... F24H 1/121 338/218 |
| 4,541,898 | A | * | 9/1985 | Mase | ..................... H05B 3/141 204/424 |
| 4,749,440 | A | * | 6/1988 | Blackwood | ....... H01L 21/31116 134/1.3 |
| 5,371,830 | A | * | 12/1994 | Wachenheim | ....... H05B 3/0052 392/487 |
| 6,228,563 | B1 | * | 5/2001 | Starov | ....................... G03F 7/42 216/57 |
| 6,242,165 | B1 | * | 6/2001 | Vaartstra | ................... G03F 7/42 134/1 |

(Continued)

FOREIGN PATENT DOCUMENTS

JP    2007-270231    10/2007
JP    2008-159663    7/2008

(Continued)

*Primary Examiner* — David G Cormier
(74) *Attorney, Agent, or Firm* — Myers Bigel, P.A.

(57) ABSTRACT

A method for processing a substrate includes: loading a substrate in a processing space of a vessel; drying the substrate using a supercritical fluid of a first temperature in the processing space, and thermally decomposing a contamination source disposed in the processing space by transferring heat to the processing space by using a non-reactive fluid of a second temperature that is higher than the first temperature.

20 Claims, 14 Drawing Sheets

100A

100B

(56) References Cited

U.S. PATENT DOCUMENTS

| | | | |
|---|---|---|---|
| 6,312,526 B1 * | 11/2001 | Yamamuka | C23C 16/4401 118/506 |
| 6,736,149 B2 * | 5/2004 | Biberger | H01L 21/67167 134/102.2 |
| 6,763,840 B2 * | 7/2004 | DeSimone | B08B 7/0021 134/105 |
| 7,201,807 B2 | 4/2007 | Yim et al. | |
| 8,197,603 B2 * | 6/2012 | Jackson | B08B 7/0021 134/1 |
| 8,741,783 B2 | 6/2014 | Kameda et al. | |
| 8,771,429 B2 | 7/2014 | Ji et al. | |
| 2003/0121170 A1 * | 7/2003 | Achkire | B08B 3/10 34/78 |
| 2003/0177659 A1 * | 9/2003 | Saito | H01L 21/67034 34/330 |
| 2007/0134919 A1 * | 6/2007 | Gunji | C23C 16/16 438/680 |
| 2011/0155180 A1 | 6/2011 | Moon et al. | |
| 2012/0048304 A1 * | 3/2012 | Kitajima | H01L 21/67034 134/30 |
| 2013/0019905 A1 | 1/2013 | Ji et al. | |
| 2013/0318812 A1 * | 12/2013 | Kim | F26B 21/12 34/282 |
| 2014/0083450 A1 | 3/2014 | Ye | |
| 2014/0250714 A1 | 9/2014 | Ji et al. | |

FOREIGN PATENT DOCUMENTS

| | | |
|---|---|---|
| KR | 10-0249387 B1 | 12/1999 |
| KR | 1020010074029 A | 8/2001 |
| KR | 1020040101666 A | 12/2004 |
| KR | 1020050032943 A | 4/2005 |
| KR | 1020120056620 A | 6/2012 |
| KR | 1020130010826 A | 1/2013 |

* cited by examiner

APPARATUS AND METHODS FOR SUBSTRATE PROCESSING AND MANUFACTURING INTEGRATED CIRCUIT DEVICES

CROSS-REFERENCE TO RELATED APPLICATIONS

This application claims the benefit of Korean Patent Application No. 10-2014-0114526, filed on Aug. 29, 2014, the disclosure of which is incorporated herein by reference in its entirety.

BACKGROUND

The inventive concept relates to an integrated circuit (IC) device and a manufacturing method thereof, and more particularly, to an apparatus for processing a substrate using a supercritical fluid, an apparatus for manufacturing an IC device, a method of processing a substrate, and a method of manufacturing an IC device.

As the design rules for IC devices decrease, the critical dimensions of semiconductor devices decrease to about 20-30 nm or lower. Accordingly, a process of forming a deep and narrow pattern that has a relatively large aspect ratio of about 5 or higher, and cleaning and drying processes according thereto, are required. As such, for the manufacturing of highly integrated IC devices, a method using a supercritical fluid for performing a predetermined process of, for example, etching, cleaning, or drying, has been suggested. However, in the existing apparatus and methods for processing a substrate using a supercritical fluid, since a contamination source remaining inside a vessel used for the processing of a substrate using a supercritical fluid is adsorbed onto the substrate, the substrate is contaminated.

SUMMARY

The inventive concept provides an apparatus and method for processing a substrate which may prevent a substrate that is processed by using a supercritical fluid from being contaminated by a contamination source remaining in a vessel used for the processing of the substrate.

The inventive concept provides an apparatus and method for manufacturing an integrated circuit (IC) device which may prevent a substrate for manufacturing a highly integrated circuit, the substrate being processed by using a supercritical fluid, from being contaminated by a contamination source remaining in a vessel used for the processing of the substrate.

According to an aspect of the inventive concept, there is provided an apparatus for processing a substrate, which includes a vessel including a processing space for processing the substrate, a first supply port through which a supercritical fluid of a first temperature is supplied to the vessel, a second supply port through which a non-reactive fluid of a second temperature that is higher than the first temperature is supplied to the vessel, a vent port through which a fluid is vented out of an inside of the vessel, a first supply line connected to the first supply port and forming a flow path for the supercritical fluid, and a second supply line connected to the second supply port and forming a flow path for the non-reactive fluid.

The apparatus may further include a heating apparatus that is provided on the second supply line and that heats the non-reactive fluid supplied to the inside of the vessel through the second supply line. The heating apparatus may include a heating wire. The heating apparatus may include a lighting apparatus that irradiates light.

The vessel may include an upper case and a lower case that are coupled to each other to be capable of being opened with respect to each other so as to be moved or switched between a closed position where the processing space is hermetically sealed and an open position where the processing space is open to the atmosphere. The first supply port and the vent port may be formed in the lower case and the second supply port may be formed in the upper case.

The second supply port may include a plurality of supply holes at or connected to the processing space.

The vessel may include an upper case and a lower case that are detachably coupled to each other to be capable of moving between a closed position where the processing space is is hermetically sealed and an open position where the processing space is open to the atmosphere, and the upper case and the lower case may be separated from each other in the open position to face each other with a gap between the upper case and the lower case.

The apparatus may further include a third supply port through which a pressure control fluid is supplied to the processing space, and a third supply line connected to the third supply port and forming a flow path for the pressure control fluid.

According to another aspect of the inventive concept, there is provided an apparatus for manufacturing an integrated circuit (IC) device, which includes a cleaning unit for cleaning a substrate, and a drying unit comprising at least one chamber for drying a cleaned substrate and a heating apparatus connected to the at least one chamber, wherein the at least one chamber includes a vessel defining or providing a processing space for processing the cleaned substrate, a first supply port through which a supercritical fluid of a first temperature is supplied to the vessel, a second supply port through which a non-reactive fluid of a second temperature that is higher than the first temperature is supplied to the vessel, a vent port through which a fluid is vented out of an inside of the vessel, a first supply line connected to the first supply port and providing a flow path for the supercritical fluid, a second supply line connected to the second supply port and providing a flow path for the non-reactive fluid, with the heating apparatus provided on the second supply line and configured to heat the non-reactive fluid that is supplied to the inside of the vessel through the second supply line.

The cleaning unit may include a wet processing apparatus that performs wet processing by supplying a process solution to the substrate.

The apparatus may further include a conveying unit that removes or takes out the substrate that has been cleaned in the cleaning unit, supplies a drying prevention solution to the clean substrate to maintain the substrate in a wet state, and conveys the substrate that is in the wet state to the drying unit. The conveying unit may include a conveying member for supporting the substrate, and a wet conveying portion for supplying the drying prevention solution to the substrate.

The drying unit may include a plurality of chambers, and each of the plurality of chambers may be configured to be connected to the heating apparatus.

The drying unit may further include a flow rate control unit for controlling a flow rate of the non-reactive fluid supplied to the inside of the vessel.

The drying unit may further include a pressure gauge for monitoring a pressure of the inside of the vessel.

The vessel may include an upper case and a lower case that are detachably coupled to each other and configured to move between a closed position where the processing space is is hermetically sealed and an open position where the processing space is open to the atmosphere, the first supply port and the vent port are formed in the lower case, and the second supply port is formed in the upper case. The upper case and the lower case may be separated from each other in the open position and face each other with a gap between the upper case and the lower case.

The heating apparatus may include a heating wire or a lighting apparatus.

The at least one chamber may further include a third supply port for supplying a pressure control fluid to the processing space, and a third supply line connected to the third supply port and providing a flow path for the pressure control fluid.

According to another aspect of the inventive concept, there is provided a method for processing a substrate, which includes loading a substrate in a processing space of a vessel, drying the substrate using a supercritical fluid of a first temperature in the processing space, and thermally decomposing a contamination source disposed in the processing space by transferring heat to the processing space by using a non-reactive fluid of a second temperature that is higher than the first temperature.

The thermally decomposing of a contamination source disposed in the processing space may include transferring heat to the processing space by forming a stream of the non-reactive fluid of a second temperature that is higher than the first temperature through the processing space and venting the non-reactive fluid out of the vessel.

The thermally decomposing of a contamination source disposed in the processing space may be performed in a state in which the substrate is present in the processing space, and in the thermally decomposing of a contamination source disposed in the processing space, the contamination sources disposed on a surface of the substrate and an inner wall of the vessel may be thermally decomposed by transferring heat to the surface of the substrate and the inner wall of the vessel by using the non-reactive fluid.

The method may further include unloading the substrate from the vessel after the drying of the substrate and before the thermally decomposing of the contamination source disposed in the processing space, wherein the thermally decomposing of a contamination source disposed in the processing space is performed in a state in which the substrate is not present in the processing space.

The second temperature may be selected within a range of about 30-1000° C.

The drying of the substrate may include increasing a pressure of the processing space to a first pressure, and applying a pressure pulse to the substrate in the processing space by alternately repeating at least two times decreasing a pressure of the processing space from the first pressure to a second pressure that is lower than the first pressure and increasing the pressure of the processing space from the second pressure to the first pressure, by controlling a supply flow rate of the supercritical fluid.

The thermally decomposing of a contamination source disposed in the processing space may include applying a pressure pulse to the processing space by alternately repeating at least two times a first process of maintaining the pressure of the processing space at a first pressure and a second process of maintaining the pressure of the processing space at a second pressure that is higher than the first pressure. The applying of a pressure pulse to the processing space may include controlling the pressure of the processing space by controlling a flow rate of the non-reactive fluid supplied to the inside of the vessel.

According to another aspect of the inventive concept, there is provided a method for manufacturing an integrated circuit (IC) device, which includes cleaning a substrate, and drying the cleaned substrate, wherein the drying of a cleaned substrate may include loading the cleaned substrate in a processing space of a vessel, drying the substrate using a supercritical fluid of a first temperature in the processing space, and thermally decomposing a contamination source disposed in the processing space by transferring heat to the processing space by using a non-reactive fluid of a second temperature that is higher than the first temperature.

The drying of the cleaned substrate may be performed in a drying unit including the vessel and a vent port for venting a fluid from an inside of the vessel, and the thermally decomposing of a contamination source disposed in the processing space may include receiving a flow of the non-reactive fluid into the vessel, and venting the non-reactive fluid out of the vessel through the vent port.

The vessel may include an upper case and a lower case that are detachably coupled to each other and configured to be moved between a closed position where the processing space is is hermetically sealed and an open position where the processing space is open to the atmosphere, the upper case and the lower case being separated from each other in the open position to face each other with a gap between the upper case and the lower case, and the thermally decomposing of a contamination source disposed in the processing space may include receiving a flow of the non-reactive fluid into the processing space, and venting the non-reactive fluid out of the vessel through the gap.

The non-reactive fluid may include carbon dioxide or a nitrogen gas.

The method may further include, after the cleaning of the substrate and before the drying of a cleaned substrate, rinsing the cleaned substrate with a first alcohol, and moisturizing the cleaned substrate with a second alcohol. The first alcohol and the second alcohol may be formed of the same material.

According to another aspect of the inventive concept, there is provided a method for processing a substrate. The method includes: loading a substrate in a processing space of a vessel; drying the substrate by supplying a supercritical fluid of a first temperature to the processing space; and thermally decomposing a contamination source disposed in the processing space by transferring heat to the processing space by supplying a non-reactive fluid of a second temperature that is higher than the first temperature to the processing space and then venting the non-reactive fluid from the processing space.

Venting the non-reactive fluid from the processing space may include venting the non-reactive fluid from the processing space through a vent port formed in the vessel.

The vessel may include an upper section and a lower section that are configured to be moved relative to one another between a closed position in which the vessel is sealed and an open position in which a gap is defined between the upper section and the lower section, and venting the non-reactive fluid from the processing space may include venting the non-reactive fluid from the processing space through the gap.

Thermally decomposing a contamination source disposed in the processing space may include thermally decomposing a contamination source disposed on a surface of the substrate and on an inner wall of the vessel.

The method may include removing the substrate from the vessel after drying the substrate and before thermally decomposing a contamination source disposed in the processing space, and thermally decomposing a contamination source disposed in the processing space may include thermally decomposing a contamination source disposed on an inner wall of the vessel.

Drying the substrate may include: increasing a pressure of the processing space to a first pressure; and controlling a supply flow rate of the supercritical fluid to apply a pressure pulse to the substrate in the processing space by alternately repeating at least two times decreasing the pressure of the processing space from the first pressure to a second pressure that is lower than the first pressure and increasing the pressure of the processing space from the second pressure to the first pressure.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1A:
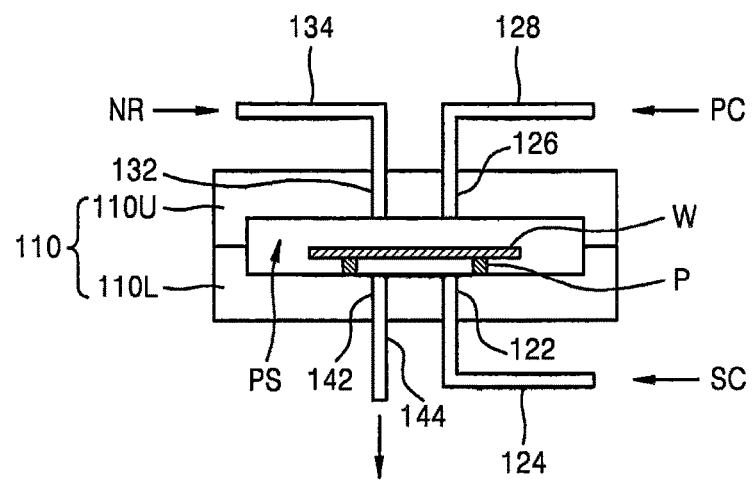
FIGS. 1A and 1B are cross-sectional views schematically illustrating major components of substrate processing apparatuses according to example embodiments.

As used herein, the term "and/or" includes any and all combinations of one or more of the associated listed items. Expressions such as "at least one of," when preceding a list of elements, modify the entire list of elements and do not modify the individual elements of the list.

Hereinafter, the present inventive concept will be described in detail by explaining preferred embodiments of the inventive concept with reference to the attached drawings. Like reference numerals in the drawings denote like elements.

Example embodiments are provided to further completely explain the present inventive concept to one of ordinary skill in the art to which the present inventive concept pertains. However, the present inventive concept is not limited thereto and it will be understood that various changes in form and details may be made therein without departing from the spirit and scope of the following claims. That is, descriptions on particular structures or functions may be presented merely for explaining example embodiments of the present inventive concept.

In the present specification, terms such as "first" and "second" are used herein merely to describe a variety of members, parts, areas, layers, and/or portions, but the constituent elements are not limited by the terms. The terms are used only for the purpose of distinguishing one constituent element from another constituent element. Thus, without departing from the scope of the present inventive concept, a first member, part, area, layer, or portion may refer to a second member, part, area, layer, or portion.

Unless defined otherwise, all terms used herein including technical or scientific terms have the same meanings as those generally understood by those of ordinary skill in the art to which the present inventive concept may pertain. The terms as those defined in generally used dictionaries are construed to have meanings matching that in the context of related technology and, unless clearly defined otherwise, are not construed to be ideally or excessively formal.

When a certain embodiment may be implemented differently, a specific process order may be performed differently from the described order. For example, two consecutively described processes may be performed substantially at the same time or performed in an order opposite to the described order.

In the drawings, the illustrated shapes may be modified according to, for example, manufacturing technology and/or tolerance. Thus, the example embodiments of the present inventive concept may not be construed to be limited to a particular shape of a part described in the present specification and may include a change in the shape generated during manufacturing, for example.

Figure 1B:
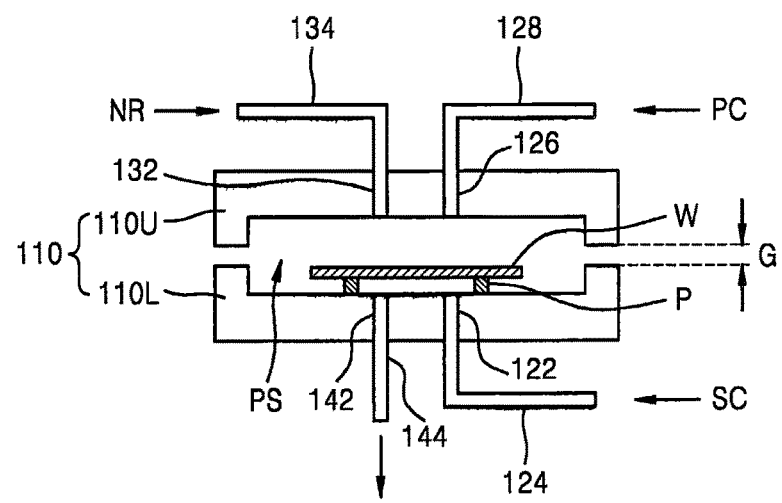

FIGS. 1A and 1B are cross-sectional views schematically illustrating a major structure of substrate processing apparatuses 100A and 100B according to example embodiments. In the substrate processing apparatus 100A illustrated in FIG. 1A, a vessel 110 that provides a processing space PS for processing a substrate W is at a closed position where the processing space PS is hermetically sealed. In the substrate processing apparatus 100B illustrated in FIG. 1B, the vessel 110 is at an open position where the processing space PS is open to the atmosphere.

Referring to FIGS. 1A and 1B, each of the substrate processing apparatuses 100A and 100B includes the vessel 110 for providing the processing space PS, a first supply port 122 for supplying a supercritical fluid SC of a first temperature to the inside of the vessel 110, and a second supply port 132 for supplying a non-reactive fluid NR of a second temperature higher than the first temperature to the inside of the vessel 110.

In some embodiments, the first temperature may be room temperature, for example, in a range of about 15-25° C., and the second temperature may be selected in a range of about 30-1000° C. In some embodiments, the non-reactive fluid NR may be formed of a carbon dioxide gas or a nitrogen gas, but not limited thereto.

The supercritical fluid has physical properties such as density, viscosity, a diffusion coefficient, and polarity which may continuously change from a gas-like state to a liquid-like state according to a change in the pressure. For example, when liquid carbon dioxide is heated in a closed container, the interface between gas and liquid disappears as temperature and pressure inside the container exceed critical points. The supercritical fluid exhibits a high solubility, a low diffusion coefficient, a low viscosity, and a low surface tension. The supercritical fluid is similar to gas in terms of a diffusion force and thus the supercritical fluid has no surface tension so as to be able to intrude into fine holes. Also, the supercritical fluid is similar to a liquid solvent in terms of solubility and the solubility of the supercritical fluid increases proportional to the pressure. Accordingly, when the supercritical fluid is used, the supercritical fluid may dry a cleaning solution or a rinse solution on a substrate without passing through the interface between gas and liquid so that generation of a leaning phenomenon or a water spot on the substrate may be restricted.

In some embodiments, the supercritical fluid may be formed of carbon dioxide. The critical temperature and critical pressure of carbon dioxide are respectively about 31° C. and 73 atm, which are relatively low. Also, the carbon dioxide is nontoxic, non-flammable, and relatively inexpensive so as to be easily used for a substrate drying process.

A support portion or member P for supporting the substrate W is formed or provided in the vessel 110.

The vessel 110 includes an upper case or section 110U and a lower case or section 110L that are detachably coupled to each other to be capable of moving between a closed position where the processing space PS is hermetically sealed and an open position where the processing space PS is open to the atmosphere.

In the open position of the vessel 110 as illustrated in FIG. 1B, the upper case 110U and the lower case 110L may be provided to face each other at positions separated from each other with a gap G between the upper case 110U and the lower case 110L. In some embodiments, the gap G may have a size of about 5-20 mm, but not limited thereto.

The first supply port 122 may be formed in the lower case 110L. A first supply line 124 forming a flow path of the supercritical fluid SC is connected to the first supply port 122.

The second supply port 132 may be formed in an upper wall, which faces a main surface of the substrate W, of the upper case 110U of the vessel 110. A second supply line 134 forming a flow path of the non-reactive fluid NR is connected to the second supply port 132.

Also, a vent port 142 for venting a fluid from the inside of the vessel 110 is formed in the lower case 110L of the vessel 110. A vent line 144 is connected to the vent port 142.

The substrate processing apparatuses 100A and 100B may further include a third supply port 126 for supplying a pressure control fluid PC to the inside of the processing space PS. A third supply line 128 forming a flow path of the pressure control fluid PC may be connected to the third supply port 126.

Figure 4A:
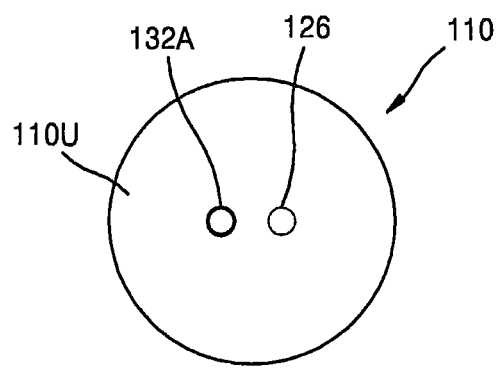
FIGS. 4A and 4B are plan views illustrating supply holes forming second supply ports formed in upper cases of vessels of substrate processing apparatuses according to example embodiments.
Figure 4B:
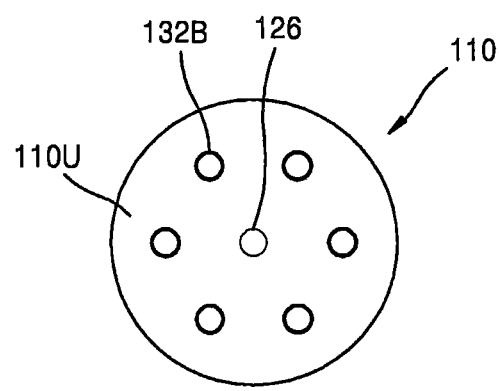

In the substrate processing apparatuses 100A and 100B respectively illustrated in FIGS. 1A and 1B, the second supply port 132 is formed in the upper wall, which faces the main surface of the substrate W, of the upper case 110U of the vessel 110. Although FIGS. 1A and 1B illustrate that only one second supply port 132 is formed in the upper case 110U of the vessel 110, the position and number of the second supply port 132 are not limited to the above description. In one example embodiment, the second supply port 132 may be formed approximately at the center portion of the upper wall of the upper case 110U of the vessel 110 and may include one supply hole or aperture 132A that is connected to the processing space PS, as illustrated in FIG. 4A. In another example embodiment, the second supply port 132 may include a plurality of supply holes or apertures 132B arranged at positions separated a predetermined distance in a radial direction from the third supply port 126 on the upper wall of the upper case 110U of the vessel 110 as illustrated in FIG. 4B. The supply holes 132B may communicate with the processing space PS.

The non-reactive fluid NR supplied to the inside of the vessel 110 through the second supply line 134 and the second supply port 132 may flow into the vessel 110 in a direction perpendicular to the main surface of the substrate W that is loaded in the vessel 110.

When the vessel 110 is in the closed position illustrated in FIG. 1A, the non-reactive fluid NR supplied to the inside of the vessel 110 through the second supply port 132 may form a stream of the non-reactive fluid NR by flowing in the processing space PS of the vessel 110 to be vented out of the vessel 110 via the vent port 142, thereby transferring heat to the processing space PS.

When the vessel 110 is in the open position illustrated in FIG. 1B, the non-reactive fluid NR supplied to the inside of the vessel 110 through the second supply port 132 may form a stream of the non-reactive fluid NR by flowing in the processing space PS of the vessel 110 to be vented out of the vessel 110 through the gap G between the upper case 110U and the lower case 110L, thereby transferring heat to the processing space PS.

Figure 2A:
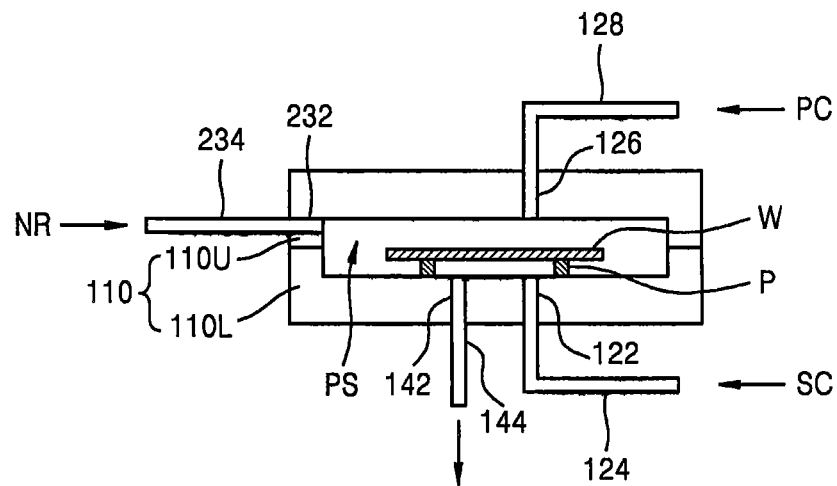
FIGS. 2A and 2B are cross-sectional views schematically illustrating major components of substrate processing apparatuses according to example embodiments.
Figure 2B:
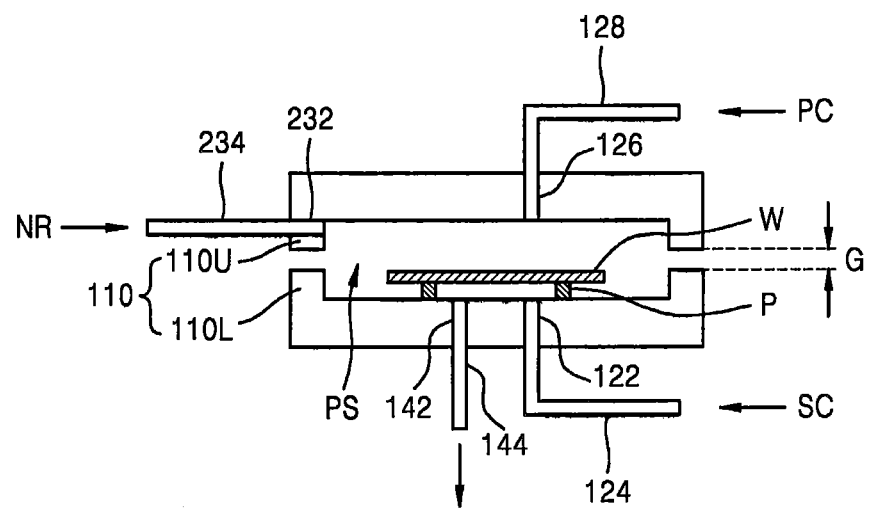

FIGS. 2A and 2B are cross-sectional views schematically illustrating major structures of substrate processing apparatuses 200A and 200B according to example embodiments. In the substrate processing apparatus 200A illustrated in FIG. 2A, the vessel 110 is in a closed position where the processing space PS is hermetically sealed. In the substrate processing apparatus 200B illustrated in FIG. 2B, the vessel 110 is in an open position where the processing space PS is open to the atmosphere.

The substrate processing apparatus 200A and 200B respectively illustrated in FIGS. 2A and 2B have substantially the same structures as those of the substrate processing apparatuses 100A and 100B of FIGS. 1A and 1B, except for including a second supply port 232 and a second supply line 234 instead of the second supply port 132 and the second supply line 134.

Referring to FIGS. 2A and 2B, each of the substrate processing apparatus 200A and 200B includes the second supply port 232 for supplying the non-reactive fluid NR of a second temperature to the inside of the vessel 110 and the second supply line 234 connected to the second supply port 232 and forming a flow path of the non-reactive fluid NR that is supplied to the vessel 110.

The second supply port 232 is formed in a side wall of the upper case 110U of the vessel 110.

The non-reactive fluid NR supplied to the inside of the vessel 110 through the second supply line 234 and the second supply port 232 may flow into the vessel 110 in a direction parallel to the main surface of the substrate W that is loaded in the vessel 110.

When the vessel 110 is in the closed position illustrated in FIG. 2A, the non-reactive fluid NR of the second temperature supplied to the inside of the vessel 110 through the second supply port 232 may form a stream of the non-reactive fluid NR by flowing in the processing space PS of the vessel 110 to be vented out of the vessel 110 via the vent port 142, thereby transferring heat to the processing space PS.

When the vessel 110 is in the open position illustrated in FIG. 2B, the non-reactive fluid NR of the second temperature supplied to the inside of the vessel 110 through the second supply port 232 may form a stream of the non-reactive fluid NR by flowing in the processing space PS of the vessel 110 to be vented out of the vessel 110 through the gap G between the upper case 110U and the lower case 110L, thereby transferring heat to the processing space PS.

Figure 3A:
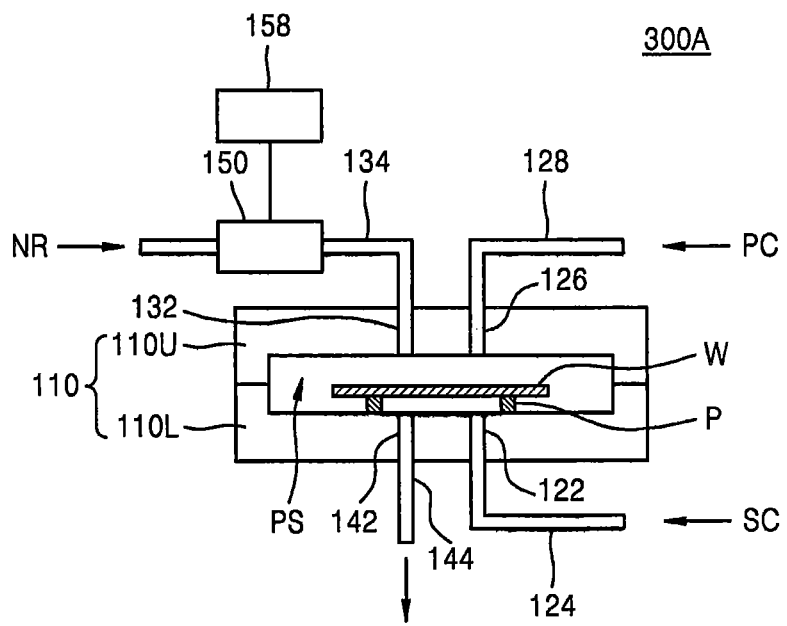
FIGS. 3A and 3B are cross-sectional views schematically illustrating major components of substrate processing apparatuses according to example embodiments.
Figure 3B:
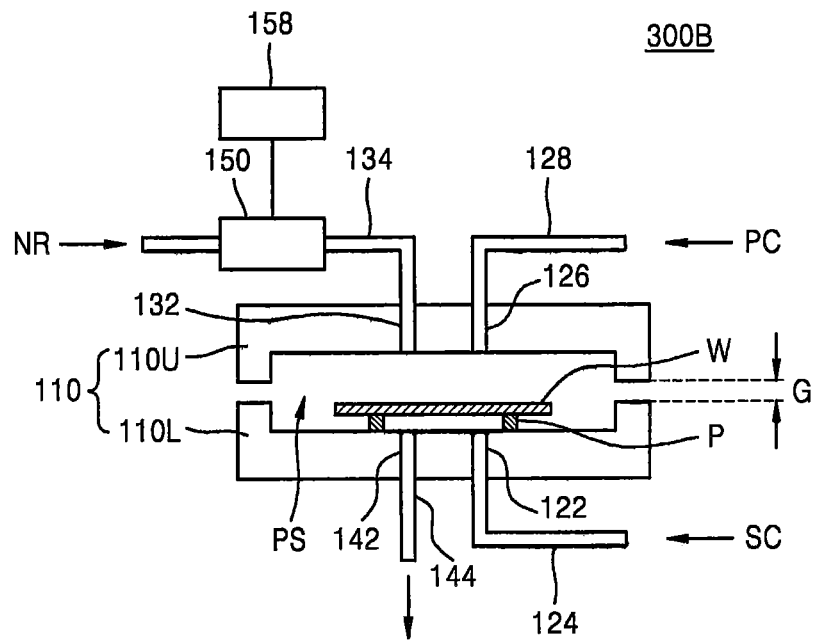

FIGS. 3A and 3B are cross-sectional views schematically illustrating major structures of substrate processing apparatuses 300A and 300B according to example embodiments. In the substrate processing apparatus 300A illustrated in FIG. 3A, the vessel 110 is in a closed position where the processing space PS is hermetically sealed. In the substrate processing apparatus 300B illustrated in FIG. 3B, the vessel 110 is in an open position where the processing space PS is open to the atmosphere.

The substrate processing apparatus 300A and 300B respectively illustrated in FIGS. 3A and 3B have substantially the same structures as those of the substrate processing apparatuses 100A and 100B of FIGS. 1A and 1B, except for further including a heating apparatus 150 installed on the second supply line 134.

Referring to FIGS. 3A and 3B, each of the substrate processing apparatuses 300A and 300B includes the heating apparatus 150 that is installed on the second supply line 134 and heats the non-reactive fluid NR that is supplied to the inside of the vessel 110 through the second supply line 134.

Figure 5A:
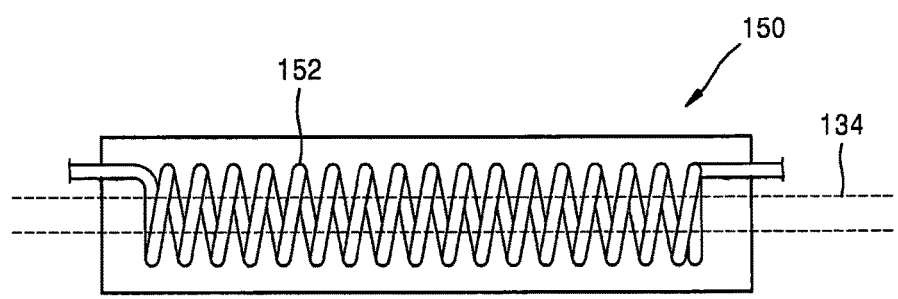
FIG. 5A is a cross-sectional view schematically illustrating an example of a structure of a heating apparatus illustrated in FIGS. 3A and 3B.

FIG. 5A is a cross-sectional view schematically illustrating an example of a structure of a heating apparatus illustrated in FIGS. 3A and 3B.

Referring to FIG. 5A, the heating apparatus 150 may include a heat wire 152 having a three-dimensional (3D) coil shape that is wound around the second supply line 134.

The heat wire 152 may be formed of an apparatus that converts electricity to heat through a Joule heating process. In some embodiments, the heat wire 152 may be formed of a nickel-chromium (NiCr) alloy, an iron-chromium-aluminum (FeCrAl) alloy, platinum, molybdenum disilicide, or silicon carbide.

Figure 5B:
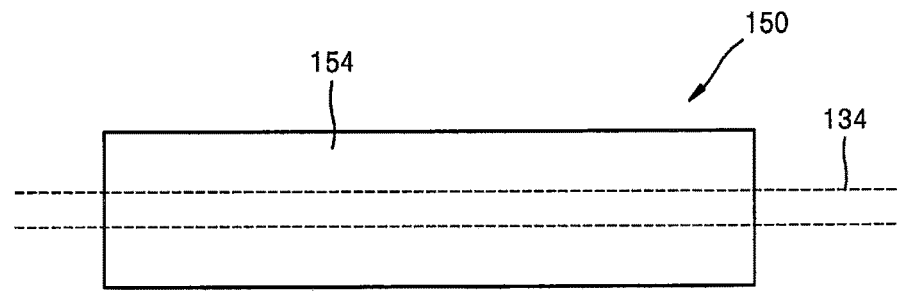
FIG. 5B is a cross-sectional view schematically illustrating another example of a structure of the heating apparatus illustrated in FIGS. 3A and 3B.

FIG. 5B is a cross-sectional view schematically illustrating another example of a structure of the heating apparatus 150 illustrated in FIGS. 3A and 3B.

Referring to FIG. 5B, the heating apparatus 150 may include a lighting apparatus 154 that is installed at a position adjacent to the second supply line 134 or to encompass the second supply line 134 and irradiates light to the second supply line 134.

In some embodiments, the lighting apparatus 154 may include a near infrared heater having a wavelength of about 0.76-1.5 µm, a mid infrared heater having a wavelength of about 1.5-5.6 µm, or a far infrared heater having a wavelength of about 5.6-1000 µm.

In some other embodiments, the heating apparatus 150 illustrated in FIGS. 3A and 3B may include a ceramic substrate that is formed of a ceramic material such as aluminum nitride (AlN) or aluminum oxide ($Al_2O_3$), and a metal wire that is wired in the ceramic substrate in a 3D coil shape and emits heat.

In some other embodiments, the heating apparatus 150 illustrated in FIGS. 3A and 3B may include a ceramic substrate that is formed of a ceramic material as described above, and a heater that includes a heat wire material printed or attached on the ceramic substrate.

Referring back to FIGS. 3A and 3B, the heating apparatus 150 may be formed of a cartridge type in-line heater capable of heating a fluid flowing through the second supply line 134 to a constant temperature. In some embodiments, the in-line heater may be installed by being inserted in a pipe forming the second supply line 134.

Each of the substrate processing apparatuses 300A and 300B may further include a temperature control unit 158 that is connected to the heating apparatus 150 and controls a heating temperature of the heating apparatus 150.

Figure 6:
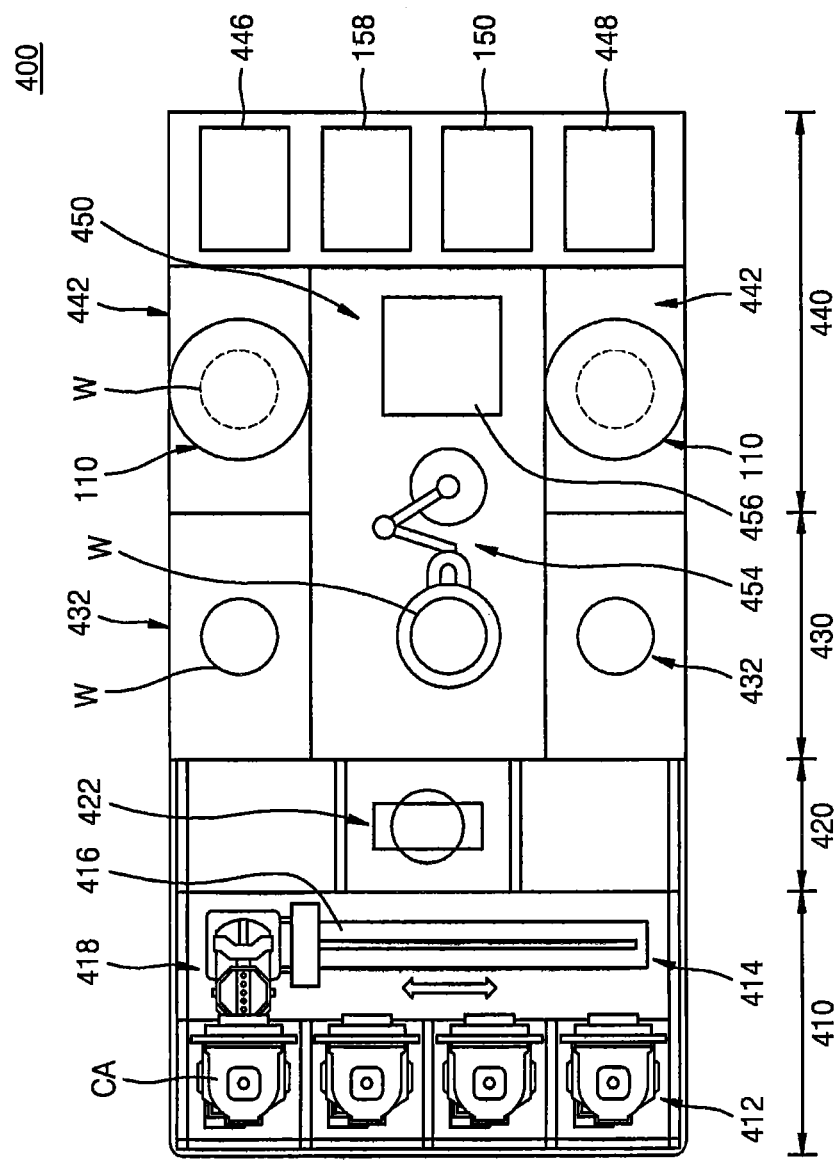
FIG. 6 is a plan view schematically illustrating major components of an apparatus for manufacturing an integrated circuit (IC) device according to an example embodiment.

FIG. 6 is a plan view schematically illustrating a major structure of an apparatus 400 for manufacturing an integrated circuit (IC) device according to an example embodiment. In FIG. 6, like reference numerals in FIG. 1A to FIG. 3B denote like elements and detailed descriptions thereof may be omitted below in the interest of brevity.

Referring to FIG. 6, the IC device manufacturing apparatus 400 includes an index module 410, a buffer unit 420, a cleaning unit 430, a drying unit 440, and a conveying unit 450.

The index module 410 includes a load port 412 and a transfer frame 414.

A carrier CA in which the substrate W is accommodated is placed on the load port 412. The index module 410 may be provided with a plurality of load ports 412, but is not limited thereto. The number of the load ports 412 may be variously determined according to a process efficiency and a process control condition of the IC device manufacturing apparatus 400. A front opening unified pod (FOUP) may be used as the carrier CA.

The transfer frame 414 may be provided with an index rail 416 and an index robot 418. In the transfer frame 414, the substrate W may be conveyed between the carrier CA placed on the load port 412 and the conveying unit 450.

In some embodiments, the substrate W may be a wafer, for example, a silicon wafer. In some other embodiments, the substrate W may be a glass substrate. Patterns, each having a relatively large aspect ratio, may be formed on the substrate W.

The buffer unit 420 may be arranged between the transfer frame 414 and the conveying unit 450. The buffer unit 420 provides a space between the conveying unit 450 and the transfer frame 414 in which the substrate W is held before being conveyed. A region or surface of the buffer unit 420 that faces the transfer frame 414 and a region or surface of the buffer unit 420 that faces the conveying unit 450 may be open.

The cleaning unit 430 may be configured to supply a processing solution to the substrate W to perform predetermined wet cleaning.

The drying unit 440 may be configured to dry the substrate W by using the supercritical fluid. The drying unit 440 dries the substrate W by using a low viscosity and surface tension of the supercritical fluid. The drying unit 440 may be arranged to be separated or spaced apart from the cleaning unit 430.

The conveying unit 450 may remove or take out the substrate W cleaned in the cleaning unit 430, and may convey the substrate W to the drying unit 440 in a wet state by supplying a drying prevention solution to the cleaned substrate W.

The conveying unit 450 may include a conveying member 454 for supporting the substrate W and a wet conveying portion 456 for supplying the drying prevention solution to the substrate W. The conveying member 454 may remove or take out the substrate W from the cleaning unit 430 to convey the substrate W to the drying unit 440.

The cleaning unit 430 includes at least one wet processing apparatus 432 that performs a wet process by supplying a processing liquid to the substrate W. Although FIG. 6 illustrates that two wet processing apparatuses 432 are included in the cleaning unit 430, the present inventive concept is not limited thereto.

In the cleaning unit 430, a wet cleaning may be performed by supplying a processing liquid to the substrate W. After the cleaning process of the substrate W, a rinse process may be performed by using a rinse solution, for example, deionized water or isopropyl alcohol. Reactivity of the isopropyl alcohol with the supercritical fluid, for example, supercritical carbon dioxide, used for a subsequent drying process is good. Therefore, when isopropyl alcohol is used as the rinse solution, the isopropyl alcohol may be easily removed by the supercritical fluid, for example, supercritical carbon dioxide, in the subsequent drying process.

Also, to promote the subsequent drying process using a supercritical fluid, after the rinse process, an additional moisturization process may be performed by using a wetting solution including an organic solvent having a superior affinity for carbon dioxide to deionized water. When a surfactant is added to the wetting solution, interaction between a liquid phase component and a gas phase component is weakened and thus a vapour pressure is lowered. Accordingly, when the substrate W is conveyed from the cleaning unit 430 to the drying unit 440 in a state in which a wetting solution including a surfactant exists on the substrate W, natural drying of the substrate W may be restricted. A material that may be easily soluble in a wetting solution and a supercritical fluid, for example, a supercritical carbon dioxide, may be used as the surfactant. The surfactant may include at least one of a trimethyl nonanol (TMN) surfactant, a fluorinated surfactant having a branch, and a surfactant including a fluorinated block copolymer.

In the conveying unit 450, the wet conveying portion 456 may eject a drying prevention wetting solution onto the substrate W. Isopropyl alcohol may be used as the drying prevention wetting solution, but it is not limited thereto. The natural drying of the rinse solution on the substrate may be prevented by providing the drying prevention wetting solution onto the substrate W after the cleaning and rinse processes of the substrate W.

As such, when the substrate W is conveyed from the cleaning unit 430 to the drying unit 440, the natural drying of the rinse solution on the substrate W may be prevented by supplying the drying prevention wetting solution to the substrate W. Accordingly, when the substrate W is dried in the drying unit 440, even if an aspect ratio of the patterns formed on the substrate W is relatively high, a leaning phenomenon that the patterns are leaned by a surface tension between gas and liquid may be prevented. Also, when the substrate W on which patterns having relatively high aspect ratios are formed is wet cleaned and then dried using a supercritical fluid while preventing the natural drying, the generation of water spots on the substrate W may be reduced or restricted.

The drying unit 440 for drying the substrate W that passed through the cleaning and rinse processes in the cleaning unit 430 may include at least one chamber 442 for drying the substrate W and the heating apparatus 150 may be connected to the at least one chamber 442. Although FIG. 6 illustrates that two chambers 442 are provided in the drying unit 440, the present inventive concept is not limited thereto, and the number of the chambers 442 may be determined as necessary. The at least one chamber 442 may be formed of any one of the substrate processing apparatuses 100A, 100B, 200A, 200B, 300A, and 300B described with reference to FIGS. 1A to 5B, or a substrate processing apparatus having a structure modified and changed from the substrate processing apparatuses 100A, 100B, 200A, 200B, 300A, and 300B within a range of the technical concept of the present inventive concept. Each of the two chambers 442 may be connected to the heating apparatus 150 to heat the non-reactive fluid NR that is supplied to the inside of the vessel 110. The heating temperature of the heating apparatus 150 may be controlled by the temperature control unit 158.

The drying unit 440 may further include a flow rate control unit 446 that controls a flow rate of the non-reactive fluid NR supplied to the inside of the vessel 110. Also, the drying unit 440 may further include a pressure gauge 448 to monitor a pressure of the inside of the vessel 110.

Figure 7:
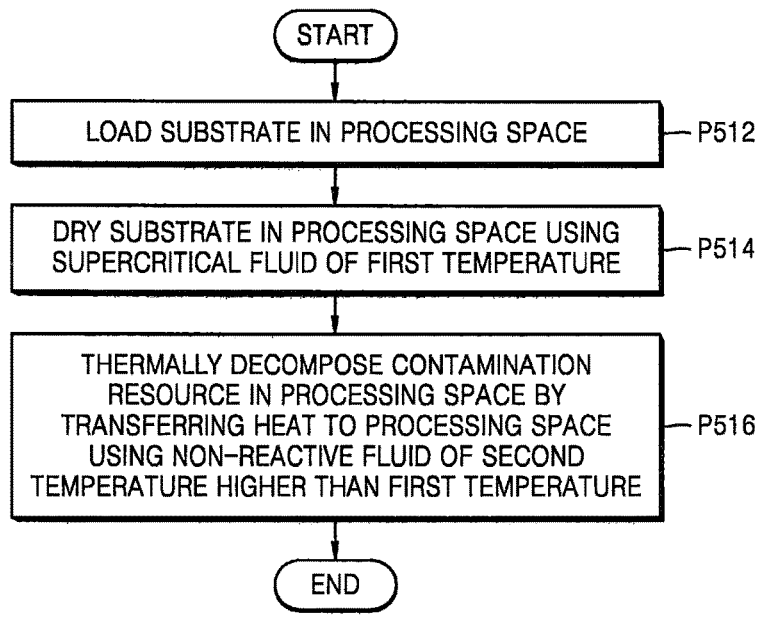
FIG. 7 is a flowchart illustrating a substrate processing method according to an example embodiment.

FIG. 7 is a flowchart for explaining a substrate processing method according to an example embodiment.

Referring to FIGS. 1A to 7, in Operation P512, the substrate W is loaded on the processing space PS of the vessel 110.

In Operation P514, the substrate W is dried in the processing space PS of the vessel 110 using the supercritical fluid SC of a first temperature.

In some embodiments, the first temperature may be room temperature, for example, in a range of about 15-25° C. In some embodiments, the supercritical fluid SC may be formed of carbon dioxide, but not limited thereto.

Figure 8:
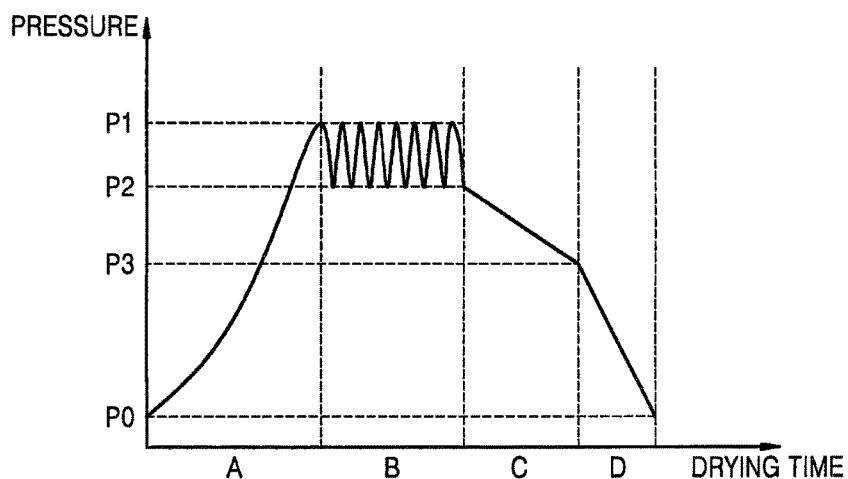
FIG. 8 is a graph showing a pressure change in a processing space of a vessel during drying a substrate by using a supercritical fluid according to a substrate processing method according to an example embodiment.

FIG. 8 is a graph showing an exemplary pressure change in the processing space PS of the vessel 110 during drying the substrate W by using the supercritical fluid SC according to Operation P514 of FIG. 7.

Referring to FIG. 8, the substrate W is loaded in the processing space PS of the vessel 110 to dry the substrate W, and then, at the closed position of the vessel 110 as illustrated in FIG. 1A, a fluid, for example, carbon dioxide, is input (e.g., supplied) into the processing space PS of the vessel 110 through the first supply line 124 and the first supply port 122 and thus the pressure in the processing space PS may be increased from an initial pressure P0 that is similar to the atmospheric pressure to a first pressure P1 (Process A of FIG. 8). A fluid may be supplied to the inside of the processing space PS of the vessel 110 through the first supply line 124 and the first supply port 122 until the fluid existing in the processing space PS of the vessel 110 reaches a saturated vapour pressure or a critical pressure. After the fluid in the processing space PS of the vessel 110 reaches the saturated vapour pressure, the temperature of the inside of the processing space PS of the vessel 110 may be increased to a temperature over a critical temperature of the fluid in the processing space PS. When the temperature of the inside of the processing space PS of the vessel 110 reaches the critical temperature of the fluid, the fluid in the processing space PS of the vessel 110 may be in a supercritical state.

Then, while the substrate drying process is performed in the processing space PS by using the supercritical fluid SC, a supply flow rate of the supercritical fluid supplied to the inside of the processing space PS is controlled so that a pressure decreasing process in which the pressure of the processing space PS is decreased from the first pressure P1 to a second pressure P2 that is lower than the first pressure P1 and a pressure increasing process in which the pressure of the processing space PS is increased from the second pressure P2 to the first pressure P1 are alternately repeated at least two times, thereby applying a pressure pulse to the substrate W in the processing space PS (Process B of FIG. 8).

In some embodiments, the first pressure P1 may be about 140 bar and the second pressure P2 may be about 100 bar, but they are not limited thereto.

In order to alternately repeat the pressure decreasing process and the pressure increasing process between the first pressure P1 and the second pressure P2 as in Process B of FIG. 8, as illustrated in FIG. 1A, a process of supplying a predetermined amount of the pressure control fluid PC to the inside of the processing space PS of the vessel 110 through the third supply line 128 and the third supply port 126 and a process of venting the gas in the processing space PS of the vessel 110 through the vent port 142 may be alternately repeated. In doing so, the pressure of the inside of the vessel 110 may be monitored by using the pressure gauge 448 described with reference to FIG. 6.

After the process of drying the substrate W loaded in the processing space PS of the vessel 110 is completed, a slow vent process in which the pressure of the inside of the processing space PS of the vessel 110 is dropped or decreased to a third pressure P3 (Process C of FIG. 8) and a fast vent process in which the pressure of the inside of the processing space PS of the vessel 110 is dropped or decreased to the initial pressure P0 that is similar to the atmospheric pressure (Process D of FIG. 8) may be sequentially performed. The slow vent process (Process C of FIG. 8) and the fast vent process (Process D of FIG. 8) may be adjusted by controlling a vent flow rate through the vent port 142.

Referring back to FIG. 7, in Operation P516, a contamination source such as an organic substance existing in the processing space PS is thermally decomposed by transferring heat to the processing space PS by using the non-reactive fluid NR of the second temperature that is higher than the first temperature.

In some embodiments, the second temperature may be selected from a range between about 30-1000° C. In some embodiments, the non-reactive fluid NR may be formed of carbon dioxide or a nitrogen gas, but it is not limited thereto.

In some embodiments, to thermally decompose the contamination source in the processing space PS, the non-reactive fluid NR of the second temperature forms a stream of the non-reactive fluid NR to be vented out of the vessel 110 through the processing space PS of the vessel 110, thereby transferring heat to the processing space PS.

In an example embodiment of transferring heat to the processing space PS, by using any one of the substrate processing apparatuses 100A, 200A, and 300A illustrated in FIGS. 1A, 2A, and 3A, the non-reactive fluid NR is supplied to the inside of the processing space PS of the vessel 110 through the second supply lines 134 and 234 and the second supply ports 132 and 232, and simultaneously, a process of venting the non-reactive fluid NR supplied to the inside of the processing space PS of the vessel 110 through the vent port 142 and the vent line 144 may be performed.

In another example embodiment to transfer heat to the processing space PS, as illustrated in FIGS. 1B, 2B, and 3B, the non-reactive fluid NR is supplied to the inside of the processing space PS of the vessel 110 through the second supply lines 134 and 234 and the second supply ports 132 and 232 by using any one of the substrate processing apparatuses 100B, 200B, and 300B in which the vessel 110 is in the open position, and simultaneously, the non-reactive fluid NR forms a stream to vent the non-reactive fluid NR supplied to the processing space PS of the vessel 110 through the gap G between the upper case 110U and the lower case 110L to the outside of the vessel 110, thereby transferring heat to the processing space PS.

As described above, since heat is transferred to the processing space PS by using the non-reactive fluid NR of the second temperature that is a relatively high temperature, a contamination source including an organic substance and remaining in the vessel 110 after the substrate W is dried by using the supercritical fluid SC may be thermally decomposed to be vented out of the vessel 110 through the vent port 142 or the gap G between the upper case 110U and the lower case 110L. Thus, the problem that the contamination source including an organic substance and remaining in the vessel 110 being adsorbed on the substrate W that has been cleaned and dried may be solved.

In the process of drying the substrate W using the supercritical fluid after cleaning the substrate W, a foreign material, for example, a carbon containing material, remaining in the patterns on the substrate W may be extracted to the outside. In a process of the extraction of the carbon containing material, the carbon containing material may be reacted with alcohol, for example, isopropyl alcohol, which was used for processing and remains without being completely dissolved by the supercritical fluid SC. The resultant of the reaction may be attached on an inner side wall of the processing space PS of the vessel 110 and may act as a contamination source. For example, in the subsequent process of drying the substrate W in a state in which the foreign material is attached on the inner side of the processing space PS of the vessel 110, the pressure increasing process and the pressure decreasing process are performed according to a change in the pressure, during which the contamination source may fall onto a surface of a wafer in the process of venting the supercritical fluid SC, generating particles on the surface of the substrate W. As a result, in continuously performing a series of drying processes with respect to a plurality of substrates, an equipment cleaning job needs to be periodically performed after stopping the equipment at predetermined intervals, which may lower an operation rate of the equipment and degrade or reduce productivity.

In the substrate processing method according to the present inventive concept as illustrated in FIG. 7, since heat is transferred to the processing space PS by using the non-reactive fluid NR of the second temperature that is a relatively high temperature, the contamination source including an organic substance remaining in the vessel 110 after the substrate W is dried using the supercritical fluid SC is thermally decomposed to be vented out of the vessel 110 through the vent port 142 or the gap G between the upper case 110U and the lower case 110L, thereby fundamentally preventing the generation of particles during the substrate drying process.

In some embodiments for performing the substrate processing process according to the present inventive concept as illustrated in FIG. 7, in a state in which the substrate W remains in the processing space PS of the vessel 110 after the drying process using the supercritical fluid SC is performed in the vessel 110, for all substrates W, heat is transferred to the processing space PS by using the non-reactive fluid NR as in Operation P516 to thermally decompose the contamination source such as organic substance remaining in the processing space PS to be vented out of the vessel 110. Accordingly, the contamination source remaining on the surface of the substrate W and the inner wall of the vessel 110 may be thermally decomposed by the heat transferred to the surface of the substrate W and the inner wall of the vessel 110 by means of the non-reactive fluid NR.

In some embodiments for performing the substrate processing process according to the present inventive concept as illustrated in FIG. 7, after the drying process using the supercritical fluid SC is performed in the vessel 110, the substrate W is unloaded from the processing space PS of the vessel 110 and, in the state in which the substrate W is not present in the processing space PS of the vessel 110, heat is transferred to the processing space PS by using the non-reactive fluid NR as in Operation P516 to thermally decompose the contamination source such as organic substance remaining in the processing space PS to be vented out of the vessel 110. Accordingly, the contamination source remaining the processing space PS of the vessel 110 may be thermally decomposed by the heat transferred to the inner wall of the vessel 110 by means of the non-reactive fluid NR.

In the example embodiments, while the substrate W is dried in the Operation P514 of FIG. 7, the isopropyl alcohol and the carbon dioxide remaining on the surface of the substrate W react with each other so that the isopropyl alcohol does not completely become supercritical and the isopropyl alcohol may remain in form of a by-product of carbon and isopropyl alcohol on the substrate W and/or the inner wall of the processing space PS of the vessel 110. In this state, to thermally decompose the contamination source such as an organic substance remaining in the processing space PS by transferring heat to the processing space PS using the non-reactive fluid NR as in Operation P516 of FIG. 7, carbon dioxide maintained at about 60-80° C. may be supplied to the inside of the processing space PS through the second supply port 132. As such, components that may serve as the contamination source may be thermally decomposed by increasing the temperature of the substrate W and/or the inner wall of the processing space PS of the vessel 110 using a gas of a relatively high temperature and may be vented out of the processing space PS.

Figure 9:
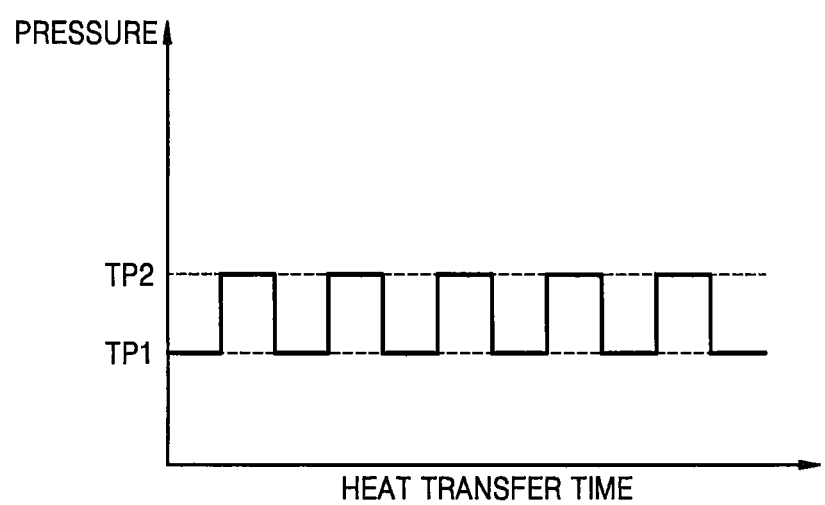
FIG. 9 is a graph showing a pressure change in a processing space of a vessel in thermally decomposing a contamination source present in the processing space by transferring heat to the processing space by using a non-reactive fluid according to a substrate processing method according to an example embodiment.

FIG. 9 is a graph showing an exemplary pressure change in the processing space PS of the vessel 110 in thermally decomposing a contamination source present in the processing space PS by transferring heat to the processing space PS by using the non-reactive fluid NR as in Operation P516 of FIG. 7.

Referring to FIG. 9, a process of maintaining the pressure of the processing space PS at a first pressure TP1 and a process of maintaining the pressure of the processing space PS as a second pressure TP2 that is higher than the first pressure TP1 are alternately repeated at least two times so as to apply a pressure pulse to the processing space PS.

In order to apply a pressure pulse to the processing space PS, the pressure of the processing space PS may be controlled by regulating a flow rate of the non-reactive fluid NR supplied to the inside of the processing space PS of the vessel 110. To this end, the pressure of the inside of the vessel 110 may be monitored by using the pressure gauge 448 described with reference to FIG. 6.

As described above with reference to FIG. 9, while heat is transferred to the processing space PS by using the non-reactive fluid NR to thermally decompose the contamination source in the processing space PS, as in Operation P516, the pressure pulse is applied to the processing space PS and thus the transfer of heat using the non-reactive fluid NR may be effectively made to a thin and deep space between the fine patterns formed on the substrate W. Also, since the non-reactive fluid NR of a high temperature is uniformly transferred to the processing space PS of the vessel 110, a contamination source removing effect may be improved on the inner wall of the processing space PS as a whole.

Figure 10:
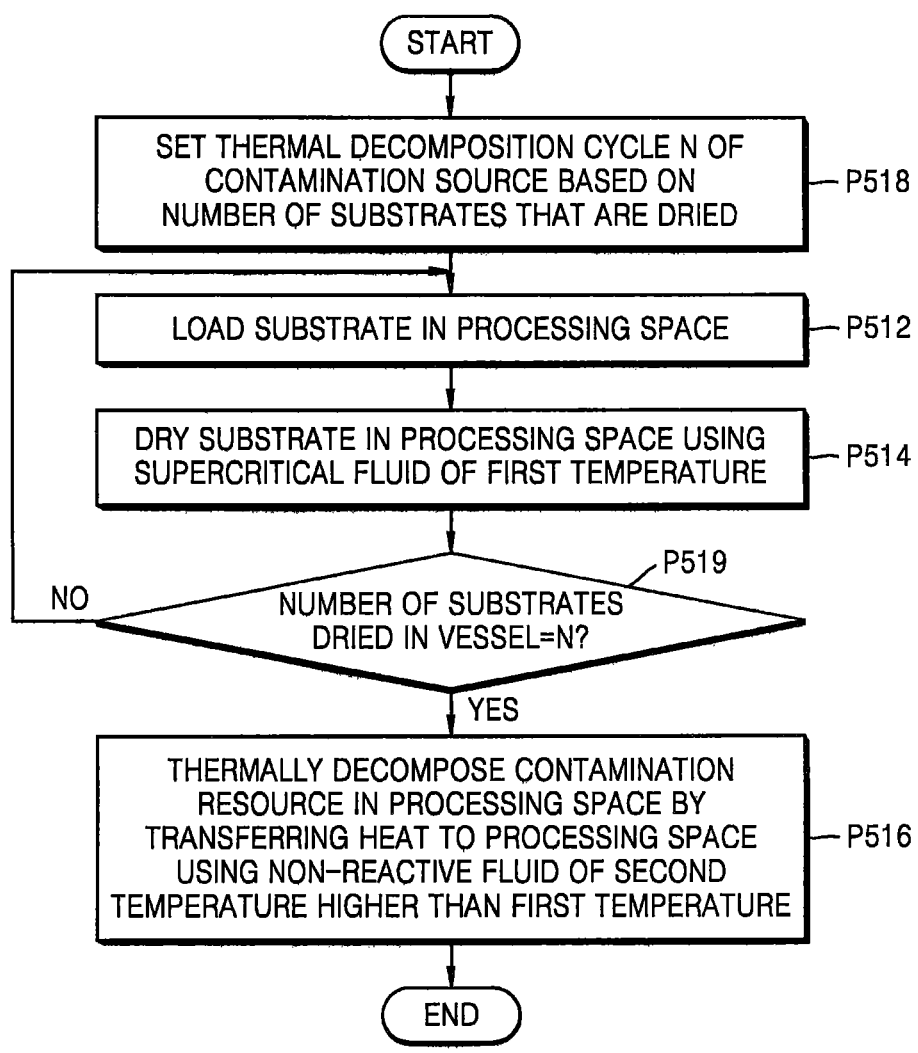
FIG. 10 is a flowchart illustrating a substrate processing method according to another example embodiment.

FIG. 10 is a flowchart for explaining a substrate processing method according to another example embodiment.

The substrate processing method described with reference to FIG. 10 is substantially similar to the substrate processing method described with reference to FIG. 7. However, in the substrate processing method of FIG. 10, in performing the process of thermally decomposing the contamination source such as an organic substance in the processing space PS according to Operation P516, a thermal decomposition cycle N of the contamination source is set based on the number of the substrates W that are to be dried in the vessel 110 and the thermal decomposition process of the contamination source using the non-reactive fluid NR is performed for each cycle N set as above.

In detail, in Operation P518, a thermal decomposition cycle N of the contamination source is set based on the number of the substrates W that are to be dried in the vessel 110.

In some embodiments, the thermal decomposition cycle N may be determined in a method of previously setting the number of the substrates W that are to be dried using the supercritical fluid SC in the vessel 110. For example, the thermal decomposition cycle N of the contamination source may be set such that the contamination source such as an organic substance in the processing space PS may be thermally decomposed by heat to be vented out of the processing space PS by transferring the heat to the processing space PS by using the non-reactive fluid NR as in Operation P516, for each time when the drying process using the supercritical fluid SC is performed with respect to ten sheets of the substrates W.

Then, Operation P512 and Operation P514 are performed as described above with reference to FIG. 7.

In Operation P519, it is determined whether the number of the substrates W dried in the vessel 110 is a predetermined number, for example, 10. In Operation P519, if it is determined that the number of the substrates W dried in the vessel 110 does not reach the predetermined number, the substrate W that has undergone a drying process in the vessel 110 is unloaded and then Operation P512 and Operation P514 are sequentially performed again. In Operation P519, if it is determined that the number of the substrates W dried in the vessel 110 has reached the predetermined number, Operation P516 may be performed. The thermal decomposition of the contamination source in the processing space PS according to Operation P516 may be performed after unloading the substrate W that has been dried in the vessel 110 or in a state in which the substrate W that has been dried remains in the vessel 110.

Then, when at least one substrate W remains to be dried, the processes after Operation P518 or Operation P512 may be performed again.

Figure 11:
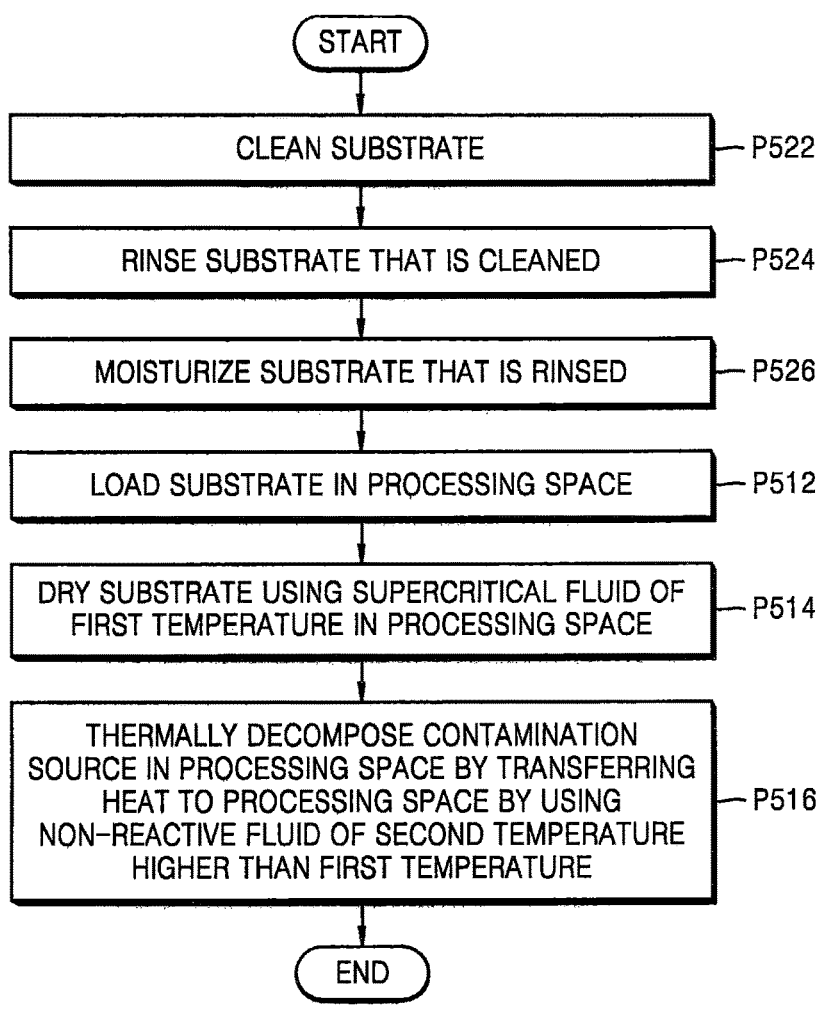
FIG. 11 is a flowchart illustrating a method for manufacturing an IC device according to an example embodiment.

FIG. 11 is a flowchart for explaining a method for manufacturing an IC device according to an example embodiment.

Referring to FIG. 1A to FIG. 11, the substrate W is cleaned in Operation P522.

The cleaning process of the substrate W may be performed in a wet cleaning method in the cleaning unit 430 of the IC device manufacturing apparatus 400 illustrated in FIG. 6.

In Operation P524, a rinse process is performed on the cleaned substrate W.

In some embodiments, the rinse process may be performed by using deionized water or alcohol. For example, although the rinse process may be performed by using isopropyl alcohol, the present inventive concept is not limited thereto.

When isopropyl alcohol is used as a rinse solution in the rinse process, solubility of the isopropyl alcohol with carbon dioxide that is a supercritical fluid used for the subsequent drying process is high so that the isopropyl alcohol may be easily removed.

In Operation P526, the surface of the substrate W passing through the rinse process is moisturized.

In some embodiments, in order to promote the subsequent drying process using a supercritical fluid, after the rinse process is performed according to Operation P524 described above, the substrate W may be moisturized by using an organic solvent, for example, isopropyl alcohol, having a superior affinity for carbon dioxide to deionized water as a wetting solution.

The wetting solution may further include a surfactant. When the surfactant is included in the wetting solution, the interaction between a liquid phase component and a gas phase component is weakened and thus a vapour pressure may be lowered. Accordingly, when the substrate W is conveyed from the cleaning unit 430 to the drying unit 440, the substrate W is conveyed with the wetting solution including a surfactant disposed on the substrate W, thereby restricting natural drying of the substrate W.

Then, Operation P512, Operation P514, and Operation P516 may be sequentially performed as described above with reference to FIG. 7.

Figure 12:
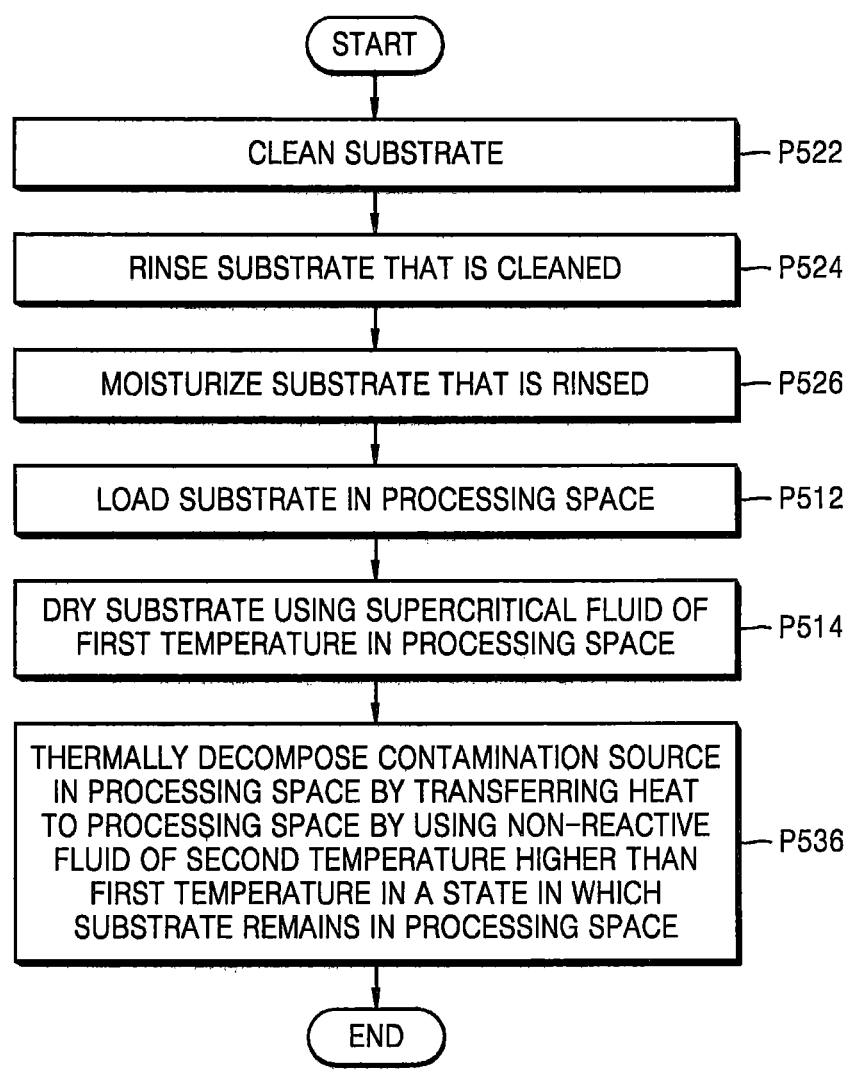
FIG. 12 is a flowchart illustrating a method for manufacturing an IC device according to another example embodiment.

FIG. 12 is a flowchart for explaining a method for manufacturing an IC device according to another example embodiment. The IC device manufacturing method of FIG. 12 is substantially similar to the IC device manufacturing method described with reference to FIG. 11, except for performing Operation P536 instead of Operation P516 of FIG. 11.

In detail, after the drying process using the supercritical fluid SC is performed in the vessel 110 according to Operation P514, in Operation P536, in the state in which the substrate W remains in the processing space PS of the vessel 110, in a method similar to that described in Operation P516 of FIG. 7, heat is transferred to the processing space PS by using the non-reactive fluid NR to thermally decompose the contamination source such as organic substance remaining in the processing space PS to be vented out of the vessel 110. Accordingly, the contamination source remaining on the surface of the substrate W and on the inner wall of the vessel 110 may be thermally decomposed by the heat transferred to the surface of the substrate W and the inner wall of the vessel 110 by means of the non-reactive fluid NR.

Figure 13:
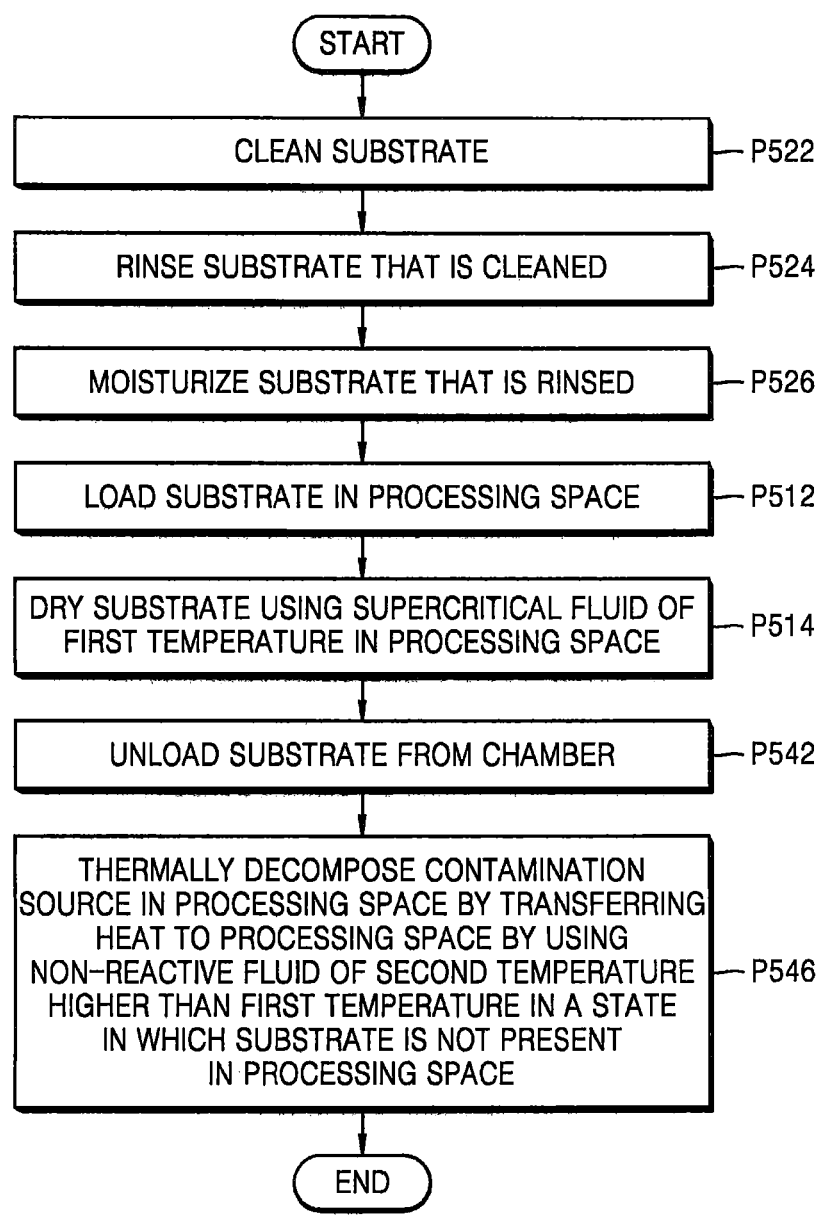
FIG. 13 is a flowchart illustrating a method for manufacturing an IC device according to another example embodiment.

FIG. 13 is a flowchart for explaining a method for manufacturing an IC device according to another example embodiment. The IC device manufacturing method of FIG. 13 is substantially similar to the IC device manufacturing method described with reference to FIG. 11, except for performing Operation P542 and Operation P546 instead of Operation P516 of FIG. 11.

In detail, after the drying process using the supercritical fluid SC is performed in the vessel 110 according to Operation P514, in Operation P542, the substrate W is unloaded from the vessel 110.

In Operation P546, in the state in which the substrate W is not present in the processing space PS of the vessel 110, in a method similar to that described in Operation P516 of FIG. 7, heat is transferred to the processing space PS by using the non-reactive fluid NR to thermally decompose the contamination source such as organic substance remaining in the processing space PS to be vented out of the vessel 110. Accordingly, the contamination source remaining in the processing space PS of the vessel 110 may be thermally decomposed by the heat transferred to the inner wall of the vessel 110 by means of the non-reactive fluid NR.

Figure 14:
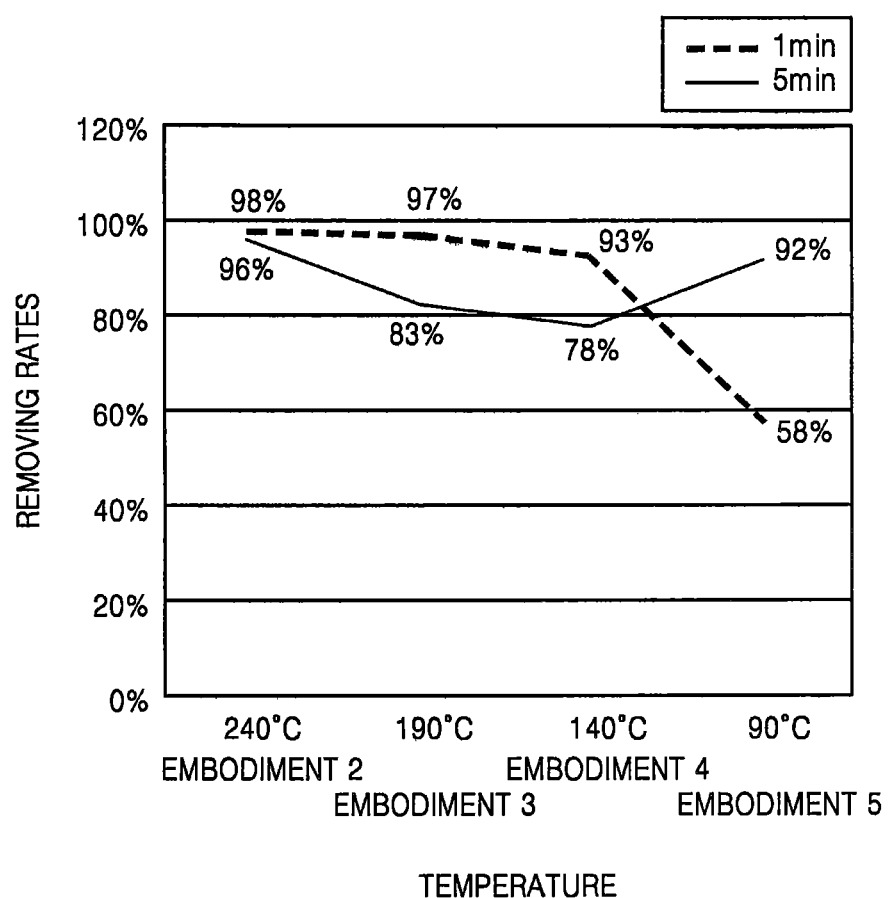
FIG. 14 is a graph showing a result of evaluation of effects according to a substrate processing method according to an example embodiment.

FIG. 14 is a graph showing a result of evaluation of effects according to a substrate processing method according to an example embodiment.

For the evaluation of FIG. 14, a processing process is performed on a plurality of substrate samples according to the substrate processing methods according to example embodiments. In this state, the number of particles before the thermal decomposition process of the contamination source according to Operation P516 of FIG. 7 is performed and the number of particles after the thermal decomposition process of the contamination source according to Operation P516 of FIG. 7 is performed are compared with each other to produce a particle removal rate by the thermal decomposition process.

During the thermal decomposition process, carbon dioxide is used as the non-reactive fluid NR and the particle removing rates according to the temperature and time during the thermal decomposition process are compared and shown in FIG. 14.

The result of FIG. 14 shows that the thermal decomposition process in which carbon dioxide is used as the non-reactive fluid NR has a substantially superior particle removal rate.

Figure 15:
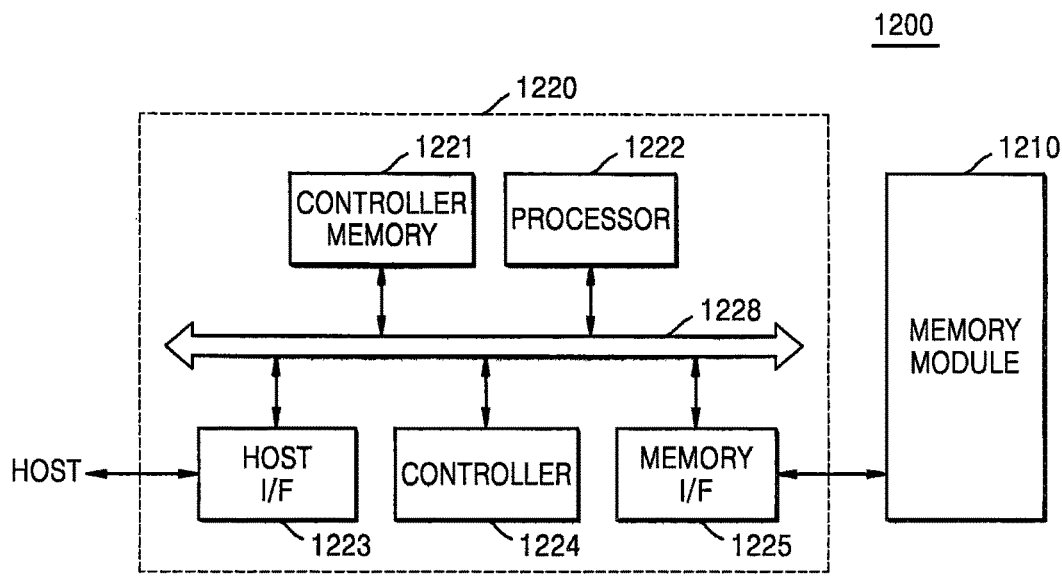
FIG. 15 is a block diagram of a memory card including an IC device manufactured by a substrate processing method and an IC device manufacturing method according to example embodiments.

FIG. 15 is a block diagram of a memory card 1200 including an IC device manufactured by a substrate processing method and an IC device manufacturing method according to example embodiments.

The memory card 1200 may include a memory controller 1220 that generates a command and address signal and a memory module 1210 that includes a flash memory that includes, for example, one or a plurality of flash memory devices. The memory controller 1220 includes a host interface 1223 that transmits command and address signals to a host or receives the command and address signals from the host and a memory interface 1225 that transmits the command and address signal to the memory module 1210 or receives the command and address signal from the memory module 1210. The host interface 1223, a controller 1224, and the memory interface 1225 communicate with a controller memory 1221 such as synchronous random access memory (SRAM) and a processor 1222 such as a central processing unit (CPU) via a common bus 1228.

The memory module 1210 receives a command and address signal from the memory controller 1220, stores data in at least one of the memory devices on the memory module 1210 in response to the command and address signals, and searches for the data in at least one of the memory devices. Each memory device includes a plurality of memory cells that may be addressed and a decoder that receives the command and address signal and generates a column signal and a row signal to access at least one of memory cells that may be addressed during programming and reading-out operations.

Each constituent part including the memory controller 1220 of the memory card 1200, the electronic devices 1221, 1222, 1223, 1224, and 1225 included in the memory controller 1220, and the memory module 1210 may include or be included in an IC device that is manufactured by the substrate processing method or IC device manufacturing method according to the above-described example embodiments.

Figure 16:
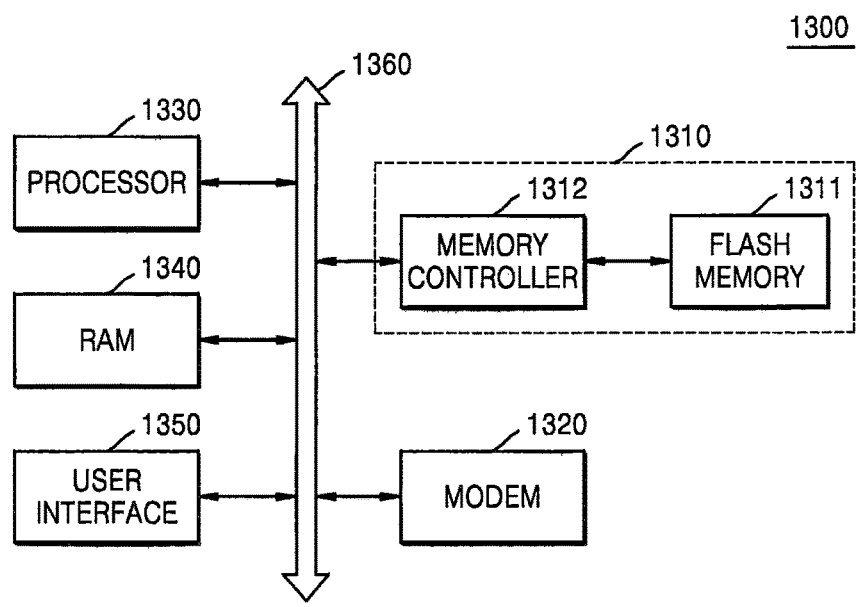
FIG. 16 is a block diagram of a memory system employing a memory card that includes an IC device manufactured by a substrate processing method and an IC device manufacturing method according to example embodiments.

FIG. 16 is a block diagram of a memory system 1300 employing a memory card 1310 that includes an IC device manufactured by the substrate processing method and the IC device manufacturing method according to the above-described example embodiments.

The memory system 1300 may include a processor 1330 such as CPU that communicates via a common bus 1360, random access memory (RAM) 1340, a user interface 1350, and a modem 1320. Each of the above parts transmits a signal to the memory card 1310 and receives a signal from the memory card 1310, via the common bus 1360. Each of the parts of the memory system 1300 including the processor 1330, the RAM 1340, the user interface 1350, and the modem 1320, together with the memory card 1310, may include an IC device that is manufactured by the IC device manufacturing method according to the above-described example embodiments. In particular, each of the parts of the memory system 1300 may include an IC device manufactured by the substrate processing method and the IC device manufacturing method according to the above-described example embodiments.

The memory system 1300 may be applied to a variety of electronic application fields. For example, the memory system 1300 may be applied to solid state drives (SSD), complementary metal-oxide-semiconductor image sensors (CIS), and computer applied chip set fields.

The memory systems and devices disclosed in the present specification may be packaged in a certain type of a variety of device package types, for example, a ball grid array (BGA), a chip scale package (CSP), a plastic leaded chip carrier (PLCC), a plastic dual in-line package (PDIP), a multi-chip package (MCP), a wafer-level fabricated package (WFP), a wafer-level processed stock package (WSP), etc., but they are not limited thereto.

The substrate processing apparatus according to the present inventive concept includes a non-reactive fluid supply line for providing a flow path of a non-reactive fluid of a temperature higher than the temperature of the supercritical fluid used for drying a substrate. In the substrate processing apparatus configured as above, after the substrate is dried by using the supercritical fluid, a contamination source remaining on a surface of the substrate and inside the vessel is thermally decomposed by using the non-reactive fluid of a relatively high temperature to be vented out of the vessel. Accordingly, according to the present inventive concept, the substrate may be prevented from being contaminated by the contamination source remaining in the vessel after the substrate is dried by using the supercritical fluid.

While the inventive concept has been particularly shown and described with reference to example embodiments thereof, it will be understood that various changes in form and details may be made therein without departing from the spirit and scope of the following claims.

What is claimed is:

1. An apparatus for processing a substrate, the apparatus comprising:
   a vessel including a processing space for processing the substrate;
   a supercritical fluid supply containing a supercritical fluid;
   a first supply line connected to the supercritical fluid supply and forming a flow path for the supercritical fluid;
   a first supply port connected to the first supply line and through which the supercritical fluid of a first temperature is supplied to the vessel;
   a non-reactive gas supply containing a non-reactive gas;
   a second supply line connected to the non-reactive gas supply and forming a flow path for the non-reactive gas;
   a second supply port connected to the second supply line and through which the non-reactive gas of a second temperature that is higher than the first temperature is supplied to the vessel;
   a heating apparatus that is provided on the second supply line and that heats the non-reactive gas supplied to the inside of the vessel through the second supply line, wherein a portion of the second supply line passes through the heating apparatus; and
   a vent port through which a fluid is vented out of an inside of the vessel,
   wherein the vessel comprises an upper case and a lower case,
   wherein the first supply port is formed only in the lower case, the vent port is formed in the lower case, and the second supply port is formed in the upper case,
   wherein the second supply port comprises a plurality of supply holes at the processing space, and
   wherein the upper case is free of any supply ports that supply supercritical fluid to the vessel.

2. The apparatus of claim 1, wherein the heating apparatus comprises a heating wire that has a coil shape and is wound around the second supply line within the heating apparatus.

3. The apparatus of claim 1, wherein the heating apparatus surrounds the second supply line and comprises a far infrared heater that irradiates far infrared radiation having a wavelength of about 5.6-1000 μm inwardly toward the second supply line.

4. The apparatus of claim 1, wherein the upper case and the lower case are coupled to each other and capable of being opened with respect to each other so as to move between a closed position wherein the processing space is hermetically sealed and an open position wherein the processing space is open to the atmosphere.

5. The apparatus of claim 1, wherein the upper case and the lower case are detachably coupled to each other to be capable of moving between a closed position wherein the processing space is hermetically sealed and an open position wherein the processing space is open to the atmosphere, and
   the upper case and the lower case are separated from each other in the open position to face each other with a gap between the upper case and the lower case.

6. The apparatus of claim 1, further comprising:
   a pressure control fluid supply containing a pressure control fluid;

a third supply line connected to the pressure control fluid supply and forming a flow path for the pressure control fluid;
a third supply port connected to the third supply line and through which the pressure control fluid is supplied to the processing space.

7. The apparatus of claim 6, wherein:
the third supply port is formed in the upper case; and
the plurality of supply holes are radially spaced apart from and surround the third supply port.

8. The apparatus of claim 1, wherein the supercritical fluid supply is configured to supply the supercritical fluid through the first supply line and the first supply port to dry the substrate and thereafter the non-reactive gas supply is configured to supply the non-reactive gas through the second supply line and the second supply port with the non-reactive gas at the second temperature to thermally decompose a contamination source disposed in the processing space.

9. The apparatus of claim 1, wherein the second temperature is between 60° C. and 80° C.

10. An apparatus for manufacturing an integrated circuit (IC) device, the apparatus comprising:
a cleaning unit for cleaning a substrate;
a drying unit comprising a plurality of chambers each for drying a cleaned substrate and a heating apparatus connected to the plurality of chambers;
a supercritical fluid supply; and
a non-reactive gas supply,
wherein the plurality of chambers each comprise:
    a vessel defining a processing space for processing the cleaned substrate, wherein the vessel comprises an upper case and a lower case;
    a first supply line connected to the supercritical fluid supply and providing a flow path for the supercritical fluid;
    a first supply port connected to the first supply line and through which the supercritical fluid of a first temperature is supplied to the vessel, wherein the first supply port is formed only in the lower case;
    a second supply line connected to the non-reactive gas supply and providing a flow path for the non-reactive gas;
    a second supply port connected to the second supply line and through which the non-reactive gas of a second temperature that is higher than the first temperature is supplied to the vessel, wherein the second supply port is formed in the upper case; and
    a vent port through which a fluid is vented out of an inside of the vessel, wherein the vent port is formed in the lower case,
wherein the upper case is free of any supply ports that supply supercritical fluid to the vessel,
wherein the heating apparatus is connected to each chamber and is configured to heat the non-reactive gas that is supplied to the inside of the vessel through the second supply port.

11. The apparatus of claim 10, wherein the cleaning unit comprises a wet processing apparatus that performs wet processing by supplying a process solution to the substrate.

12. The apparatus of claim 10, wherein the drying unit further comprises at least one flow rate control unit for controlling a flow rate of the non-reactive gas supplied to the inside of each vessel.

13. The apparatus of claim 10, wherein the drying unit further comprises at least one pressure gauge for monitoring a pressure of the inside of each vessel.

14. The apparatus of claim 10, wherein:
the upper case and the lower case in each chamber are detachably coupled to each other and configured to be moved between a closed position wherein the processing space is hermetically sealed and an open position wherein the processing space is open to the atmosphere, and
the upper case and the lower case in each chamber are separated from each other in the open position and face each other with a gap between the upper case and the lower case.

15. The apparatus of claim 10, wherein the heating apparatus comprises a heating wire or a lighting apparatus,
wherein the heating wire is formed of a nickel-chromium (NiCr) alloy, an iron-chromium-aluminum (FeCrAl) alloy, platinum, molybdenum disilicide, or silicon carbide, and
wherein the lighting apparatus includes a far infrared heater having a wavelength of about 5.6-1000 μm.

16. The apparatus of claim 10, further comprising a pressure control fluid supply containing a pressure control fluid, wherein each chamber further comprises:
a third supply line connected to the pressure control fluid supply and providing a flow path for the pressure control fluid;
a third supply port connected to the third supply line for supplying the pressure control fluid to the processing space.

17. The apparatus of claim 10, wherein the heating apparatus surrounds a respective second supply line and comprises a far infrared heater that irradiates far infrared radiation having a wavelength of about 5.6-1000 μm inwardly toward the respective second supply line.

18. An apparatus for processing a substrate, the apparatus comprising:
a vessel including a processing space for processing the substrate;
a supercritical fluid supply containing a supercritical fluid;
a first supply port configured to supply the supercritical fluid from the supercritical fluid supply to the vessel at a first temperature;
a first supply line forming a flow path for the supercritical fluid between the supercritical fluid supply and the first supply port;
a non-reactive gas supply containing a non-reactive gas;
a second supply port configured to supply the non-reactive gas from the non-reactive gas supply to the vessel;
a second supply line forming a flow path for the non-reactive gas between the non-reactive gas supply and the second supply port;
a heater associated with the second supply line and configured to heat the non-reactive gas flowing in the second supply line to a second temperature that is higher than the first temperature, wherein a portion of the second supply line passes through the heater; and
a vent port through which a fluid is vented out of an inside of the vessel,
wherein the second temperature is between 60° C. and 80° C.,
wherein the vessel comprises an upper case and a lower case,
wherein the first supply port is formed only in the lower case, the vent port is formed in the lower case, and the second supply port is formed in the upper case, and
wherein the upper case is free of any supply ports that are configured to supply supercritical fluid to the vessel.

19. The apparatus of claim 18, wherein the heater surrounds the second supply line and comprises a far infrared heater that irradiates far infrared radiation having a wavelength of about 5.6-1000 μm inwardly toward the second supply line.

20. The apparatus of claim 18, wherein the second supply port comprises a plurality of supply holes at the processing space.

\* \* \* \* \*